(12) United States Patent
Rhine et al.

(10) Patent No.: US 6,787,339 B1
(45) Date of Patent: Sep. 7, 2004

(54) MICROFLUIDIC DEVICES HAVING EMBEDDED METAL CONDUCTORS AND METHODS OF FABRICATING SAID DEVICES

(75) Inventors: David B. Rhine, Phoenix, AZ (US); Thomas J. Smekal, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 638 days.

(21) Appl. No.: 09/676,512

(22) Filed: Oct. 2, 2000

(51) Int. Cl.[7] ............................................. C12N 13/00
(52) U.S. Cl. .................... 435/173.7; 219/690; 219/691; 219/692; 219/693
(58) Field of Search ...................... 216/2, 41; 438/692, 438/737, 738, 739, 745

(56) References Cited

U.S. PATENT DOCUMENTS

| | | | |
|---|---|---|---|
| 5,457,073 A | 10/1995 | Ouellet | |
| 5,591,578 A | 1/1997 | Meade et al. | |
| 5,705,348 A | 1/1998 | Meade et al. | |
| 5,770,369 A | 6/1998 | Meade et al. | |
| 5,780,234 A | 7/1998 | Meade et al. | |
| 5,824,473 A | 10/1998 | Meade et al. | |
| 5,846,849 A | * 12/1998 | Shaw et al. ............. | 438/739 X |
| 5,846,860 A | 12/1998 | Shih et al. | |
| 5,905,307 A | 5/1999 | Onoda | |
| 5,952,172 A | 9/1999 | Meade et al. | |
| 6,071,699 A | 6/2000 | Meade et al. | |
| 6,087,100 A | 7/2000 | Meade et al. | |
| 6,090,933 A | 7/2000 | Kayyem et al. | |
| 6,096,273 A | 8/2000 | Kayyem et al. | |
| 6,177,250 B1 | 1/2001 | Meade et al. | |
| 6,180,352 B1 | 1/2001 | Meade et al. | |
| 6,200,761 B1 | 3/2001 | Meade et al. | |
| 6,221,583 B1 | 4/2001 | Kayyem et al. | |
| 6,232,062 B1 | 5/2001 | Kayyem et al. | |
| 6,238,870 B1 | 5/2001 | Meade et al. | |
| 6,258,545 B1 | 7/2001 | Meade et al. | |
| 6,268,149 B1 | 7/2001 | Meade et al. | |
| 6,268,150 B1 | 7/2001 | Meade et al. | |
| 6,277,576 B1 | 8/2001 | Meade et al. | |

FOREIGN PATENT DOCUMENTS

| | | |
|---|---|---|
| WO | WO95/15971 A2 | 6/1995 |
| WO | WO96/40712 A1 | 12/1996 |
| WO | WO97/46568 A1 | 12/1997 |
| WO | WO98/12430 A1 | 3/1998 |
| WO | WO98/20162 | 5/1998 |
| WO | WO00/62931 A1 | 10/2000 |
| WO | WO01/41931 A2 | 6/2001 |
| WO | WO01/50131 A1 | 7/2001 |
| WO | WO01/54813 A2 | 8/2001 |

* cited by examiner

*Primary Examiner*—Duy-Vu Deo
(74) *Attorney, Agent, or Firm*—William E. Koch

(57) ABSTRACT

The present invention provides low cost microfluidic devices having embedded metal conductors. The devices of the invention comprise a electronic component comprising a substrate having a first surface, a layer of electrically-conductive material deposited on a portion of the first substrate surface, a first sublayer of electrically-insulating material deposited on the first substrate surface and on the layer of electrically-conductive material, a second sublayer of electrically-insulating material deposited on the first sublayer of insulating material, and a third sublayer of electrically-insulating material deposited on the layer of dielectric material, and a fluid-handling component having a contoured surface affixed to the electronic component. The devices of the invention are advantageously used for performing electric field lysis and the polymerase chain reaction. The invention further advantageously provides simple, low cost methods for fabricating such microfluidic devices.

37 Claims, 10 Drawing Sheets

MICROFLUIDIC DEVICES HAVING EMBEDDED METAL CONDUCTORS AND METHODS OF FABRICATING SAID DEVICES

BACKGROUND OF THE INVENTION

1. Field of the Invention

This invention relates to the field of microfluidics. More particularly, this invention relates to photolithographic methods for fabricating microfluidic devices having embedded metal conductors.

2. Description of Related Art

There has been tremendous growth over the past 5 years in the use of micromachining for fabricating microstructures, microsensors, and microfluidic devices, and in integrating these microstructures with electronic circuits. Micromachining is the process of forming structures having micron-sized detail by producing patterns in layers of material deposited on a substrate. The material layers can be formed using a variety of processes, including vapor deposition and spin coating. Patterns are produced in these material layers by processes such as precision physical machining, chemical etching, laser ablation, focused ion beam etching, ultrasonic drilling and electrodischarge machining, to yield the micromachined device.

Concurrently, uses for microfluidic devices are becoming increasingly widespread. Microfluidic devices are used in applications ranging from biological assays (the so-called "lab-on-a-chip" devices) to drug delivery systems to manufacturing processes for pharmaceuticals and cellular macromolecules. Microfluidic devices can even be used to transmit force and energy in hydraulic systems. For example, microfluidic devices may be used in the design of smart surgical tools where the motion of the human hand must be scaled down to sub-millimeter dimensions, with a corresponding reduction in force. Microscale devices also permit the assembly of a multiplicity of different effector devices in one compact, interconnected system. For example, individual microfluidic accessories such as mixers, microcontactors, reactors, pumps, and valves may be added on a substrate containing microfluidic channels that connect such components in a microfluidic device.

Microstructure technology offers distinct advantages over "macroscale" technology, including, for example, the ability to perform efficient and rapid chemical analyses at a lower cost per analysis, because of decreased sample volume requirements and increased throughput. Small sample volumes are advantageous because they allow a user to perform multiple analyses in parallel using a single sample on a single chip. Smaller sample volumes are also advantageous in instances where the amount of material is limiting, such as in isolating rare natural products or in neonatal care where the amount of blood drawn from sick infants is preferably kept to a minimum.

A variety of microfluidic applications require electrical conductors. Conductors are used to form electrical interconnections ("interconnects") between elements of a microfluidic device, such as electrodes, and elements external to the device, such as power sources. Such interconnects can provide electrical flow to the electrode to power electrohydrodynamic pumps or to induce electrolysis of a sample fluid. Conductors may also be used as resistive heaters for sample fluids or as temperature sensors in microfluidic applications.

Developments in the semiconductor processing industry have facilitated the fabrication of micron-sized structures, including sensors and monitoring systems that can be used in microfluidic devices. The fabrication of microfluidic devices requires a method of producing fluidic connections, referred to as microchannels, and electrical interconnects between regions of a single device or between a device and accessories such as automatic valves, pumps, or syringes. Existing methods of forming microchannels and electrical interconnects involve a complex process having multiple steps including via-filling, sealing, firing, lapping and polishing. These processes are time-consuming and costly and have questionable reliability. Low-cost methods such as photolithography have been used extensively in the fabrication of integrated circuits that require numerous electrical interconnections, but have not been applied in the field of microfluidic devices. Additionally, existing methods of fabricating microfluidic devices are not useful in forming interconnects having dimensions of less than 0.5 mm.

U.S. Pat. No. 5,457,073 to Ouellet and U.S. Pat. No. 5,905,307 to Onoda disclose methods for manufacturing semiconductor wafers by using photolithography and etching to create contact holes connecting two metallization layers separated by an electrically-insulating sublayer.

U.S. Pat. No. 5,846,860 to Shih et al. discloses a method of using tetraethylorthosilicate ("TEOS") to form improved embedded contact junctions on semiconductor wafer.

Thus there remains a need in the art for simple, low cost, photolithographic methods for fabricating electrical interconnects and fluid-handling elements in microfluidic devices having dimensions, where the interconnects and fluid-handling elements have widths and depths less than 0.5 mm.

SUMMARY OF THE INVENTION

The invention disclosed herein provides microfluidic devices having embedded metal conductors and methods for manufacturing such devices. The present invention solves the above-referenced problems in the art by utilizing photolithographic methods for fabricating fluidic pathways and electronic interconnects in microfluidic devices, thereby reducing the cost and complexity of the fabrication process in comparison to traditional methods using via-filling, sealing, firing, lapping and polishing.

In a first aspect, the invention provides low-cost photolithographic methods for fabricating microfluidic devices comprising an electronic component having a substantially flat, planar surface and conductors embedded therein, and a fluid-handling component comprising a contoured surface affixed to the electronic component, wherein the contoured surface forms one or a plurality of cavities between the electronic component and the fluid-handling component. The electronic component preferably comprises a substrate having a surface, a patterned layer of electrically-conductive metal deposited on a portion of the surface of said substrate, and a layer of electrically-insulating material deposited on the patterned electrically-conductive metal layer and on the portion of the substrate surface not covered by the patterned electrically-conductive metal layer. The invention utilizes insulating materials that have good conformal or planarizing properties, wherein the conformal or planarizing properties of the insulating material result in a substantially flat, planar surface for the electronic component after depositing the insulating material on the substrate. Flat, planar surfaces are particularly desirable as they facilitate affixing the fluid-handling component to the electronic component.

The patterned layer of electrically-conductive material preferably functions as an electrical connection between an electrical source and an electrode extending into one or a plurality of cavities formed between the electronic component and the fluid-handling component, or as a heater for the contents of the cavity formed between the electronic component and the fluid-handling component. The cavities in the fluid-handling component preferably comprise a pattern of fluid-handling elements, or microchannels, or alternatively comprises a reaction chamber.

In a preferred embodiment, the invention provides a microfluidic device for performing electric-field lysis. In this embodiment, the contoured surface of the fluid-handling component forms a pattern of microchannels between the fluid-handling component and the electronic component. The electronic component in this embodiment additionally comprises an electrode extending from the embedded conductor into the pattern of microchannels, wherein the electrode introduces current into a sample fluid containing the cells to be lysed.

In an alternative preferred embodiment, the invention provides a microfluidic device for performing the polymerase chain reaction. In this embodiment, the contoured surface of the fluid-handling component forms a reaction chamber between the fluid-handling component and the electronic component. The embedded conductors of this embodiment are used as resistive heaters for a sample fluid contained in the reaction chamber and are separated from the contents of the reaction chamber by a series of electrically-insulating layers.

In a second aspect, the invention provides methods for using photolithography foil fabricating embedded conductors, electrodes, microchannels and reaction chambers in electronic and fluid-handling components of the invention. Specifically, the invention provides methods for producing the electronic components of the microfluidic devices of the invention whereby a photomask is used to transfer a pattern defining an electronic or fluid-handling element onto a layer of photoresist deposited on the substrate by exposing the photoresist layer to UV light through the photomask. The photoresist is then developed leaving the deposition pattern for the conductor or electrode materials or for etching of fluid pathways. The invention also provides methods for producing the fluid-handling components of the microfluidic devices of the invention whereby the pattern defines a mold on which the fluid-handling component material is deposited to form the contoured surface of said fluid-handling component.

Specific preferred embodiments of the present invention will become evident from the following more detailed description of certain preferred embodiments and the claims.

BRIEF DESCRIPTION OF THE DRAWINGS

Presently preferred embodiments of the invention are described with reference to the following drawings, wherein.

DETAILED DESCRIPTION OF THE INVENTION

Figure 1:
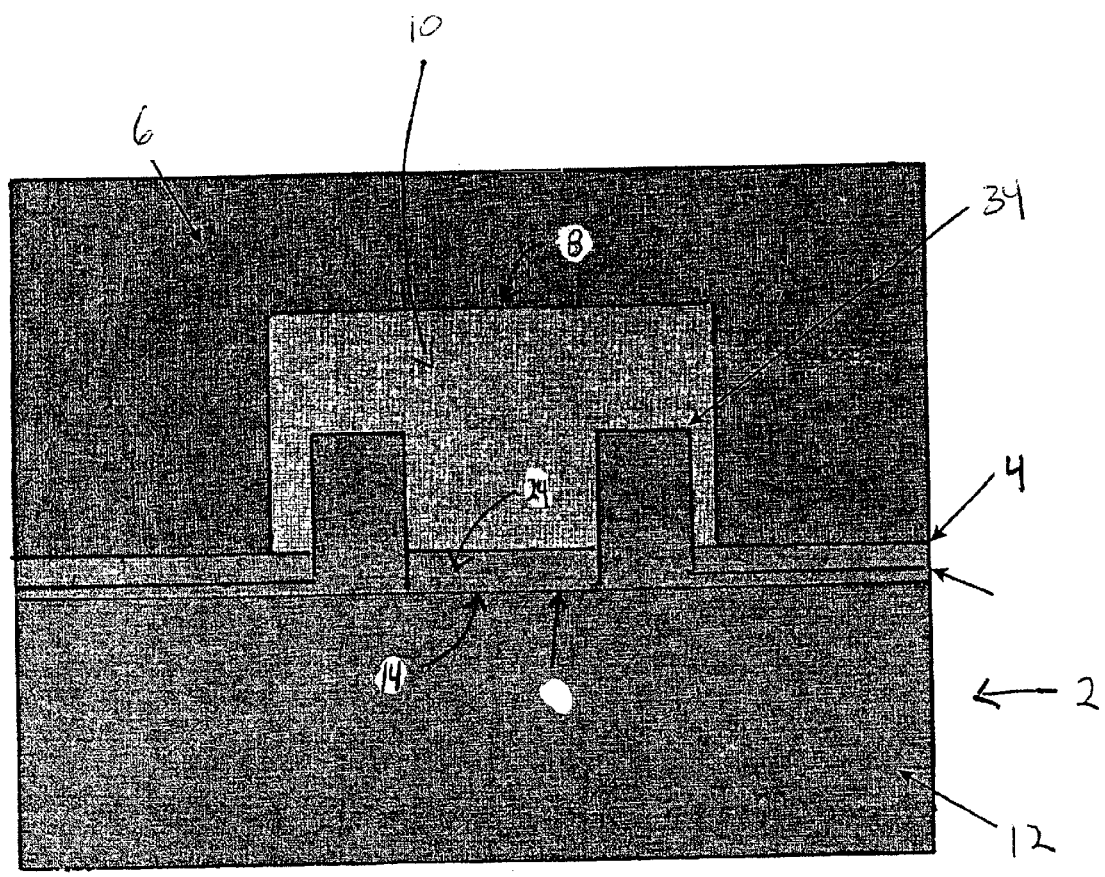
FIG. 1 is a cross-sectional view of a microfluidic device according to the invention for performing electric field lysis.

The invention provides microfluidic devices comprising microchannels in electrical or thermal contact with embedded metal conductors comprising an electronic component having a substantially planar surface and embedded conductors bonded with a fluid-handling component having a contoured surface defining a pattern of microchannels or a reaction chamber. The inventive devices provided herein are advantageously used to perform reactions such as electric field lysis and the polymerase chain reaction.

The invention also provides low-cost photolithographic methods for fabricating the embedded conductors and other electronic components of the microfluidic devices of the invention. The invention further provides low-cost photolithographic methods for fabricating the microchannels, reaction chambers and other fluid-handling elements of the microfluidic devices of the invention.

As used herein, the term "microchannel" refers to a fluid flow pathway in a microfluidic device or connecting multiple microfluidic devices. As described herein, microchannels of the present invention are about 5 to 200 microns deep, 10 to 100 microns wide, and have lengths ranging from millimeters to centimeters.

As used herein, the term "interconnect" refers to an electrical connection between sections of a microfluidic device or between multiple microfluidic devices. More particularly, the term interconnect refers to a layer of electrically-conductive metal deposited on the surface of a substrate that provides electrical communication between sections of a microfluidic device or between multiple microfluidic devices.

As used herein, the terms "photoresist" and "resist" refer to chemical preparations whose solubility in a given fluid is altered by applying UV light. Photoresists are used to form patterns on a substrate by exposing the photoresist to UV-light through a photomask having an image of the desired pattern and then developing the photoresist to remove the sections of photoresist with the highest solubility in the developing fluid. The pattern transferred depends on the type of photoresist used, either positive or negative photoresist. When positive photoresist is used, the pattern formed in the photoresist after developing corresponds exactly to the image on a photomask; negative photoresist responds in the opposite manner, i.e., unexposed regions of the negative resist will dissolve in the developer while exposed regions remain behind. Because positive resist dissolves more quickly during the development process and has better resolution, it is used more widely; however, both positive and negative photoresist patterns fall within the scope of the present invention, and the choice thereof is made according to the understanding of those having skill in the art. The term "resist" is not used herein to refer to the property of electrical resistance.

As used herein, the term "photomask" refers in most preferred embodiments to a plate coated with a material opaque to the wavelength of light used in the photolithography process, wherein the opaque material is deposited on the plate in the pattern that is to be transferred to the photoresist. Typically, the plate is glass and the opaque material is chromium. When a positive photoresist is used, the portions of the photoresist not covered by the opaque material during exposure are removed in the developing process. When a negative photoresist is used, the portions of the photoresist covered by the opaque material during exposure are removed in the developing process.

As used herein, the term "planarizing" refers to the process of smoothing steps on a material or substrate layer, wherein the resulting smooth surface is substantially planar. In reference to a material, the term "planarizing" refers to the ability of the material to smooth a stepped surface thereby forming a second substantially planar surface. Conversely, "conformal deposition" refers to the process of smoothing steps on a contoured material or substrate surface while retaining the general contour of the surface. A material referred to as having "good conformal properties," when deposited on an underlying surface, forms a smooth, but not necessarily planar, surface retaining the general contours of the underlying surface.

As used herein, the term "metallization" refers to the process of depositing a layer of metal on a surface of a component of the microfluidic device.

As used herein, the term "chemical vapor deposition" or "CVD" refers to the process of forming a material film on a substrate by decomposing a gas stream of the material using elevated temperatures (typically 400° C. to 600° C.). The decomposition reaction occurs at the surface of the substrate thus forming the desired film on the substrate surface. "Plasma enhanced CVD" or "PECVD" refers to the process of performing low-temperature CVD (200° C. to 400° C.) by generating an ionized gas stream or plasma of the desired material where the ions are recombined at the surface of the substrate to form the desired film.

As used herein, the term "anodic bonding" refers to the use of heat and/or electrostatic forces to form an airtight seal between two dissimilar materials.

As used herein, the terms "deposited" or "depositing" generically refer to the process of forming a layer of material on a surface. Specifically, deposition processes include, but are not limited to, vapor deposition, chemical vapor deposition, plasma enhanced chemical vapor deposition, electron beam evaporation, thermal evaporation, sputtering, electroplating and spin coating.

An exemplary embodiment of the microfluidic device of the present invention is illustrated in FIG. 1. As shown in FIG. 1, the microfluidic device comprises a electronic component 2 having a substantially planar first surface 4 and a fluid-handling component 6 having a contoured first surface 8, wherein the contoured first surface 8 of the fluid-handling component 6 is affixed to the substantially planar first surface 4 of electronic component 2, thereby forming a cavity 10 between the substantially planar first surface 4 of electronic component 2 and the contoured first surface 8 of fluid-handling component 6.

The electronic component 2 comprises a first substrate 12 having a surface 14, a conductor 16 deposited on a portion of first substrate surface 14, and an electrically-insulating layer 18 deposited on the conductor 16 and on the portion of the first substrate surface 14 not covered by the conductor 16.

The first substrate 12 is preferably composed of glass, plastic or silicon. Glass and plastic are particularly preferred for their low cost compared to silicon. Preferably, first substrate 12 is circular and has a diameter preferably of about 75 millimeters to about 300 millimeters, more preferably about 75 to about 150 millimeters, and most preferably about 100 millimeters. The thickness of the first substrate 12 is preferably from about 0.5 to about 10 millimeters, more preferably from about 0.5 to 5 millimeters, and most preferably about 1 millimeter. First substrate 12, however, is not limited to a specific geometry or set of dimensions, but may include additional configurations, including rectangular substrates such as microscope slides. Those of skill in the art will recognize the applicability of the methods of the present invention to a variety of substrate geometries and dimensions.

In embodiments where first substrate 12 is silicon, a second electrically-insulating layer 20 is deposited on first substrate surface 14 prior to depositing embedded conductor 16. In this embodiment, conductor 16 is embedded between the first and second electrically-insulating layers 18 and 20. Preferably, second electrically-insulating layer 20 has a thickness from about 1 to about 5 microns, more preferably from about 2 to about 5 microns, and most preferably about 4 microns.

FIG. 1 illustrates an embedded conductor 16. To be useful as an interconnect, the electrically-conductive metal 32 must have a low electrical resistance to minimize voltage drops along the interconnect lines. Preferably, embedded conductor 16 is composed of titanium (Ti), platinum (Pt), gold (Au) or a combination thereof. Most preferably, embedded conductor 16 comprises sequential layers of Ti, Pt and Au. Embedded conductor. 16 has a width preferably from about 1 to about 500 microns, more preferably from about 100 to about 500 microns, and most preferably about 500 microns. The length of embedded conductor 16 is preferably from about 1,000 to about 20,000 microns, more preferably from about 1,000 to about 10,000 microns, and most preferably about 7,500 microns. The total thickness of the embedded conductor 16 is preferably from about 0.1 to about 1 micron, more preferably from about 0.1 to about 0.5 micron, and most preferably about 0.27 micron. Most preferably, embedded conductor 16 comprises a 200 Angstrom layer of Ti, a 500 Angstrom layer of Pt, and a 2000 Angstrom layer of Au.

Electrically-insulating layer 18 is preferably composed of a material that has good planarization properties or of sequential layers of materials having either good conformal or planarizing properties, such that the layer 18 has a substantially planar surface when deposited on a stepped surface. In a preferred embodiment, electrically-insulating layer 18 is composed of three electrically-insulating sublayers. Preferably, first electrically-insulating sublayer 22 has good conformal properties, second electrically-insulating sublayer 24 has good planarization properties, and third electrically-insulating sublayer 26 has good conformal properties. Third electrically-insulating sublayer 26 is also preferably biocompatible, to prevent interaction of the material with biological samples. First electrically-insulating layer 18 may also provide thermal insulation in some embodiments. In the PCR embodiment of the device, first electrically-insulating layer 18 is thermally conductive.

In a further preferred embodiment, first electrically-insulating sublayer 22 and third electrically-insulating sublayer 26 are tetraethylorthosilicate ("TEOS"). First electrically-insulating sublayer 22 preferably has a thickness of from about 100 to about 3000 Angstroms, more preferably from about 500 to about 3000 Angstroms, and most preferably from about 1000 to about 3000 Angstroms. Third electrically-insulating layer 26 preferably has a thickness of from about 100 to about 3000 Angstroms, more preferably from about 500 to about 2000 Angstroms, and most preferably from about 1000 to about 2000 Angstroms.

Second electrically-insulating sublayer 24 is preferably composed of a planarizing material that forms a substantially planar surface when deposited on a stepped surface. Most preferably second electrically-insulating sublayer 24 is spin-on glass ("SOG"). SOG is a liquid solution containing silicate-based (substantially inorganic spin-on glasses) or siloxane-based (quasi-inorganic spin-on glasses) monomers. SOG is advantageously used for this purpose because it has adheres well to silicon, thermal oxide, chemical vapor deposition ("CVD") oxides, and aluminum. Preferably, second electrically-insulating sublayer 24 has an overall thickness of from about 1000 Angstroms to about 1 micron, more preferably from about 5000Angstroms to about 1 micron, and most preferably about 1 micron. Due to viscosity constraints on SOG, forming a layer having the desired thickness may require deposition of two or more sequential layers of SOG. Second electrically-insulating sublayer 24 is preferably formed by depositing two sequential SOG sublayers 28 and 30. Those skilled in the art, however, will recognize that any techniques allowing for deposition of the desired thickness of SOG would be equally useful.

Specific preferred embodiments of the electronic component 2 contain additional components directed to the specific use of the electronic component 2. Two particularly preferred embodiment of the device are a device for performing electric field cell lysis ("e-field lysis") and a device for performing the polymerase chain reaction ("PCR").

In the e-field lysis embodiment of the invention, shown in FIG. 1, the electronic component 2 additionally comprises an electrode 34 extending from the embedded conductor 16 through electrically-insulating layer 18. The electrode 34 is preferably composed of an elemental metal, more preferably a transition metal, even more preferably titanium (Ti), platinum. (Pt), or gold (Au), and most preferably gold. The electrode 34 preferably has a length of from about 1 to about 1000 microns, more preferably from about 100 microns to about 1000 microns, and most preferably from about 500 microns to about 1000 microns. The height of the electrode 34 is preferably from about 1 to about 50 microns, more preferably from about 10 to about 20 microns, and most preferably about 20 microns. The width of the electrode 34 is preferably from about 5 to about 100 microns, more preferably from about 10 to about 60 microns, and most preferably about 60 microns.

Figure 2:
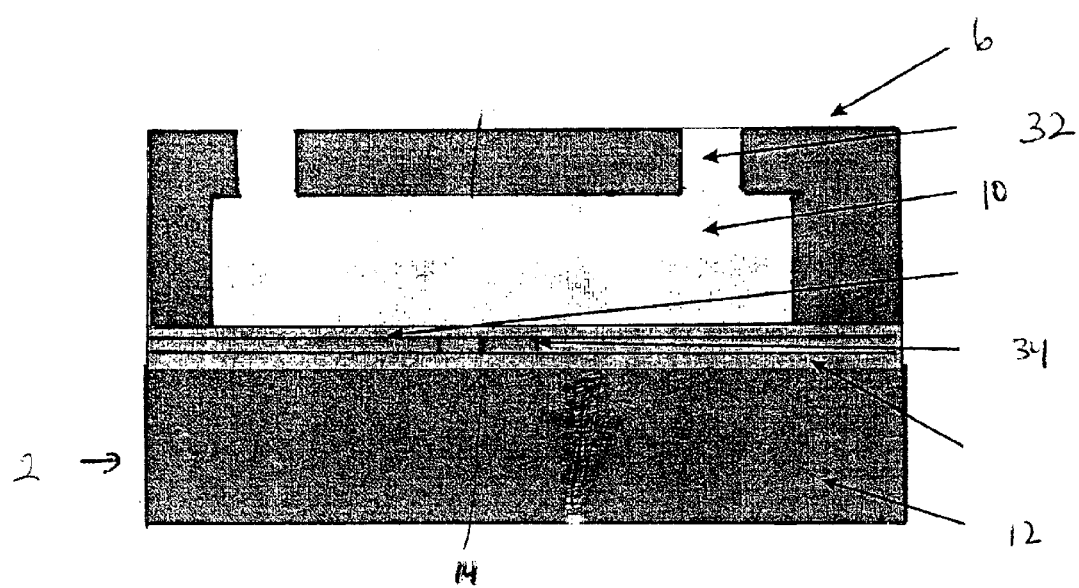
FIG. 2 is a cross-sectional view of a microfluidic device according to the invention for performing the polymerase chain reaction.

In the PCR embodiment of the microfluidic device of the invention, shown in FIG. 2, the electronic component 2 further comprises a layer of silicon 38 deposited on the second electrically-insulating layer 26. The silicon layer 38 preferably has a thickness of from about 100 to about 3000 Angstroms, more preferably from about 500 to about 3000 Angstroms, and most preferably from about 1000 to about 2000 Angstroms.

The fluid-handling component 6 is preferably composed of silicon, glass, plastic, a polymeric material, or a "glass-like" material such as quartz, sapphire or an epitaxial material. In a particularly preferred embodiment, the fluid-handling component 6 is composed of plastic, most preferably polydimethylsiloxane ("PDMS"), which is molded to form contoured surface 8 and cavity 10. In an alternative preferred embodiment, the fluid-handling component 6 is composed of glass that is etched to form contoured surface 8 and cavity 10.

The fluid-handling component 6 for the e-field lysis device preferably is composed of molded PDMS. Contoured surface 8 and cavity 10 of fluid-handling component 6 in the e-field lysis device are formed by the mold pattern and together form a pattern of microchannels 36 into which electrode 34 extends. Preferred embodiments of microchannels 36 of the present invention are about 5 to 200 microns deep, i0 to 100 microns in width, and have a length ranging from millimeters to centimeters. Particularly preferred embodiments of microchannels 36 are about 20 microns deep. The PDMS fluid-handling component 6 chemically bonds to the third electrically-insulating sublayer 26 on electronic component 2.

The fluid-handling component 6 for the PCR embodiment is fabricated by etching a second substrate to form a contoured surface 8 comprising a cavity 10. The contoured surface 8 and the cavity 10 in turn define a reaction chamber 40. In preferred embodiments, the reaction chamber 40 is preferably from about 0.1 to about 5 millimeters square, more preferably from about 1 to about 5 millimeters square, and most preferably from about 1 to 2 millimeters square, and preferably from about 0.1 to 5 millimeter deep, more preferably from about 1 to 5 millimeters deep, and more preferably from about 1 to 2 millimeters deep. These dimensions define reaction chambers that are preferably between $1 \times 10^{-5}$ ml to 0.025 ml, more preferably between 0.001 ml and 0.025 ml, and most preferably between 0.001 ml and 0.002 ml. The invention is not limited to reaction chamber having these dimensions, however, and those of skill in the art will recognize the applicability of the methods of the invention for producing microfluidic devices having different dimensions.

One or more access holes 32 extending through the fluid-handling component 6 as necessary provide access to cavity 10. The access holes 32 may be formed by any process useful for the given material, including, but not limited to, manual punching, drilling, laser drilling wet etching and plasma etching. The access holes 32 are preferably from about 0.5 to about 5 millimeters in diameter, more preferably from about 1 to about 5 millimeters in diameter, and most preferably from about 1.5 to about 2 millimeters in diameter to allow for fluid passage.

Preferred embodiments of the inventive process provided herewith for fabricating the first microfluidic devices of the invention are illustrated in FIGS. 3 and 4. FIG. 3 provides a schematic representation of the process for fabricating e-field lysis embodiments of the device. FIG. 4 provides a schematic representation of the process for fabricating PCR embodiments of the device.

Fabricating the Electronic Component

The first step in fabricating the electronic component is preparing the first substrate 12 for deposition of the electrically-conductive material 42. Prior to the deposition of the electrically-conductive material 42, first substrate 12 is cleaned, preferably in a megasonic cleaner, such as those available from CAE Ultrasonics, Jamestown, N.Y. The substrate is placed in a container with a freshly prepared cleaning solution preferably comprising equal parts (v:v) ammonium hydroxide ($NH_4OH$) and hydrogen peroxide ($H_2O_2$). Heat and mechanical vibration are then applied to clean the first substrate 12.

In a preferred embodiment of the inventive method, photolithography is used to apply a conductor pattern 44 to first substrate surface 14. The photolithography process involves the steps of priming the substrate, applying a layer of photoresist to the substrate, exposing the photoresist to UV light through a photomask, and developing the photoresist. Each of these steps is described in detail below. For a more detailed description of photolithography, see Runyan & Bean, 1994, Semiconductor Integrated Circuit Processing Technology Addison-Wesley Publ. Co., pp.161–241.

In embodiments where the first substrate 12 is silicon, a second electrically-insulating layer 20 is deposited on the first substrate surface 14 prior to the initial vapor priming of the substrate. Preferably, the second electrically-insulating layer 20 is TEOS, which is preferably deposited by plasma-enhanced chemical vapor deposition ("PECVD") in a Novellus PECVD unit. In preferred embodiments of the invention, PECVD of TEOS is performed at 350° C. for 20 minutes in an oxygen atmosphere.

Silicon substrates are also pretreated prior to photolithography. In preferred embodiments of the pretreatment step, after depositing second electrically-insulating layer 20 on the first substrate surface 14, the first substrate 12 is baked in either a vacuum or a dry nitrogen oven, such as the IMTEC Star 2000 (IMTEC Acculine, Inc., Sunnyvale, Calif.), to drive off adsorbed water from first substrate surface 14.

Following cleaning, the first substrate 12 is primed to enhance adhesion of a first photoresist layer 46 to the first substrate surface 14 and obtain a smooth, uniform coverage of the photoresist. In the priming step, the first substrate surface 14 is coated with a primer layer. Suitable primers include, but are not limited to, acetone, isopropyl alcohol, methyl alcohol, xylene, trichloroethylene and hexamethyldisilazane ("HMDS"). Most preferably, the primer is hexamethyidisilazane. Preferably, priming with HMDS is performed by placing the first substrate 12 in a vacuum oven with a container of high vapor pressure liquid HMDS. The liquid HMDS vaporizes in the vacuum and coats the first substrate surface 14. Most preferably, for a first substrate 12 with a 100 mm diameter, the substrate is maintained in the vacuum oven for 15 minutes at 150° C. with about 1 mL of HMDS. Alternatively, HMDS may be applied by dispensing a pre-determined amount of liquid HMDS on the first substrate surface 14 and spinning the substrate 12 in a spin-coater to spread out the liquid HMDS to a thin uniform coating. In this embodiment, the first substrate 12 is mounted on a chuck and placed in the spin coater, The chuck is accelerated to a rotational speed of preferably between about 1000 and about 2000 rpm, while liquid HMDS is then dispensed on the first substrate 12, thus coating the first substrate surface 14. For a 100 mm diameter substrate, approximately 3 to 4 mL of HMDS is dispensed on the substrate.

Figure 3A:
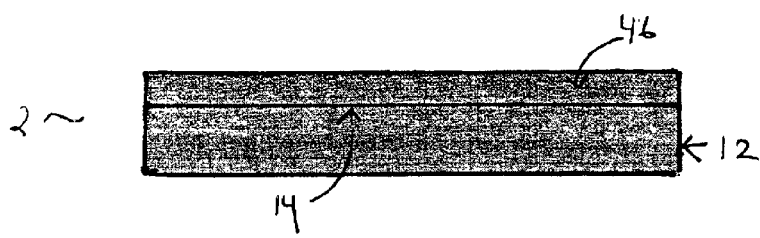
FIGS. 3A to 3Z schematically illustrate a method for fabricating a microfluidic device for performing electric field lysis.

The primed first substrate surface 14 is coated with a first photoresist layer 46, as shown in FIG. 3A. Photoresist materials typically have three components: a resin or base material, a photoactive compound, and a solvent that controls the mechanical properties of the photoresist, e.g., maintaining the photoresist in a liquid state. A preferred photoresist is AZ 6210 photoresist (AZ Electronic Materials, Somerville, N.J.); however, those skilled in the art will recognize that other photoresists having similar physical and chemical properties, such as those available from Shipley or Hitachi, may also be used. Specifically, the photoresist is selected based on the desired thickness of the photoresist layer 46, as the thickness of the photoresist layer is proportional to a fractional power of the viscosity of the photoresist.

The most commonly used method for applying photoresist is spin coating. The primed first substrate surface 14 is spin-coated by mounting first substrate 12 on a vacuum chuck in a spin-coater, such as those available from Headway Research, Garland, Tex., and then rapidly accelerating the chuck at a controlled rotation rate up to a maximum rotational speed of preferably 2000–4000 rpm while liquid photoresist is dispensed on first substrate surface 14. Typically, a significant excess of resist is dispensed to achieve a uniform layer having the desired thickness. For a substrate 100 mm in diameter, preferably about 100 to 200 milliliters of photoresist is dispensed. First substrate surface 14 coated with first resist layer 46 is illustrated in FIG. 3A.

A pattern for the embedded conductors 16 is produced on the first photoresist layer 46 using a first photomask. The photomask is typically fabricated on various types of glass or fused silica, and preferably has a high degree of optical transparency, a small thermal expansion coefficient, and a highly polished surface that reduces light scattering. The desired pattern is printed on the photomask using an opaque material, preferably chromium. Preferably, each photomask is reusable. A mask aligner, such as those available from Karl Suss, Phoenix, Ariz., is used to align the photomask with the first resist layer 46.

Figure 3B:
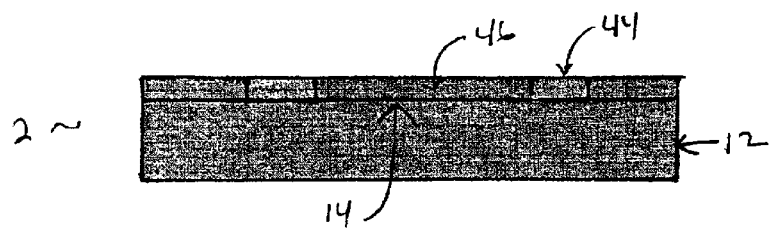

The first photomask comprises a unique development pattern that is specifically designed for the conductor pattern 44. The photoresist layer 46 is exposed to high intensity ultraviolet light through the photomask, preferably at a wavelength of 325–410 nanometers and an intensity of about 11 mA/cm. Exposure of the photoresist 46 alters the solubility of the portions of the photoresist exposed to the light (i.e. the portions of the photoresist not covered by the UV-opaque material on the photomask). The conductor pattern 44 is thereby transferred to the photoresist layer 46. Exposed first resist layer 46 is illustrated in FIG. 3B.

After UV light exposure, the portions of first photoresist layer 46 having the highest solubility are removed with a photoresist developer, completing the photolithography process.

Figure 3C:
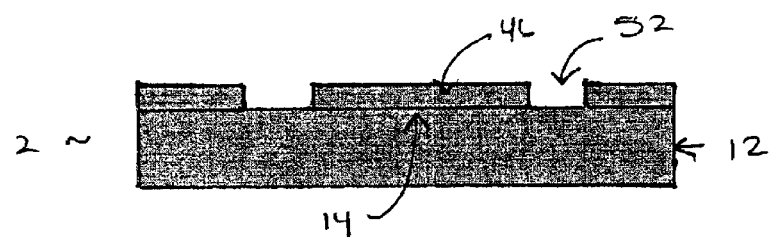

Most preferably, resist developer AZ 527 (AZ Electronic Materials, Somerville, N.J.) is used to remove excess AZ 6210 resist. Removal of excess photoresist creates a first trench 52 in the photoresist layer 46 on electronic component 2 for depositing the electrically-conductive material 42 from which the conductor 16 is formed. An example of a developed substrate is shown in FIG. 3C. Following photolithography, the electronic component 2 is cleaned using oxygen plasma in a plasma etcher such as the IPC Asher/Etcher available from Branson.

Evaporation or sputtering is used to deposit the electrically-conductive metal 32 in the first trench 52 in the photoresist layer 46 and on the remaining portions of the first photoresist layer 46. Because a single level of metal typically does not provide sufficient capability to fully interconnect complex devices, the embedded conductor 16 is advantageously created by multilevel metallization. In particularly preferred embodiments of the devices of the invention, a series of layers of electrically-conductive metal are sequentially deposited on a layer of previously exposed photoresist. The photoresist is then developed, causing the portions of the metal layers not covering the conductor pattern to "lift-off" with the developed photoresist, leaving the conductor 16.

Figure 3D:
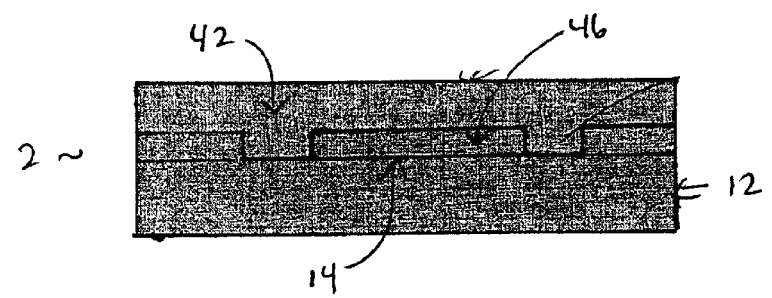

In a preferred embodiment evaporation is used to deposit the metal layers on the photoresist layer 46. In this process, electronic component 2 is loaded into a high capacity vacuum chamber that is evacuated during use preferably by either a diffusion pump or a cryopump. The metal to be deposited on electronic component 2 is loaded into a crucible, which is heated by means of an embedded resistance heater or an external power supply. The pressure in the chamber is reduced, preferably to about $1 \times 10^{-6}$ torr, causing the metal to vaporize. The vaporized metal atoms strike the electronic component 2 and accumulate to form a film or a layer of electrically-conductive material 42 on the first photoresist layer 46 and in the first trench 52, as shown in FIG. 3D. Alternatively, the metal layers may be sputtered onto the electronic component 2. While sputtered films generally have better step coverage than evaporated films, they have poor liftoff characteristics, and thus evaporative deposition is preferred.

Figure 3E:
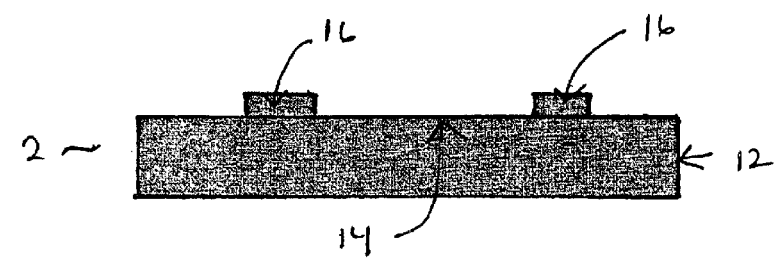

Following deposition of the electrically-conductive metal, excess metal is lifted off by immersing the electronic component 2 in a resist developer. The electrically-conductive material 42 deposited directly on first substrate surface 14 remains while the remainder of the deposited material lifts off first substrate surface 14 with the remaining portion of first photoresist layer 46, leaving conductor 16, as illustrated in FIG. 3E. Additional layers of metal can be added by depositing additional layers of photoresist and repeating the liftoff process. Alternatively, several successive layers of metal may be deposited onto a single layer of patterned photoresist and then the multiple layers of metal may be removed by developing the single layer of photoresist. The electronic component 2 is then cleaned again, preferably in a megasonic cleaner.

Figure 3F:
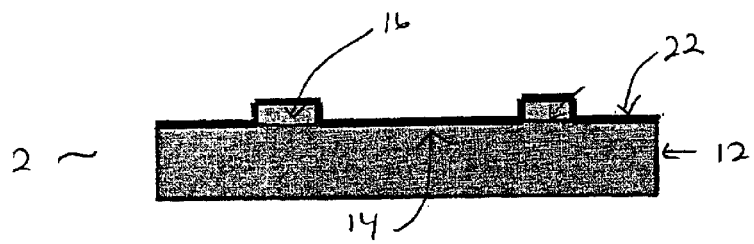

To improve uniformity and step coverage of the surface of electronic component 2 and insulate the embedded conductors 16, a first electrically-insulating sublayer 22 having good conformal properties is deposited on first substrate surface 14, as illustrated in FIG. 3F. Preferably, the first electrically-insulating sublayer 22 comprises a layer of TEOS. When the first electrically-insulating sublayer 22 is TEOS, the layer is preferably deposited by PECVD as described above. Following deposition of the first electrically-insulating sublayer, the electronic component 2 is cleaned again. Preferably, the electronic component 2 is cleaned in a 2:1 (v/v) mixture of water and hydrofluoric acid, which roughens the surface of first electrically-insulating sublayer 22 and improves adhesion of subsequent insulating sublayers.

The second electrically-insulating sublayer 24 is then deposited on electronic component 2. Preferably second electrically-insulating sublayer 24 comprises a layer of SOG, which is deposited by spin-coating as described above. When the second electrically-insulating sublayer 24 is composed of SOG, sublayer 24 is formed by depositing one or more sequential sublayers of SOG, as necessary to obtain the desired thickness for the second electrically-insulating sublayer 24. The second electrically-insulating sublayer 24 in preferred embodiments of the devices of the present invention has a thickness that requires depositing two SOG sublayers 28 and 30 to form second electrically-insulating sublayer 24.

Figure 3G:
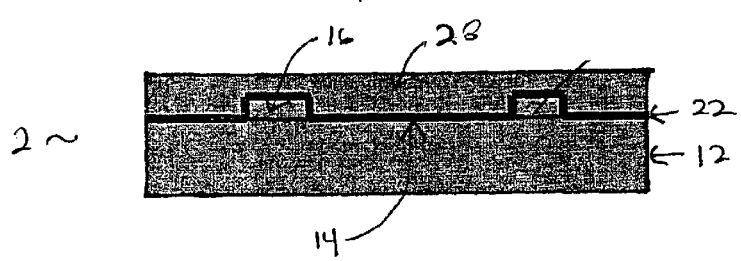
Figure 3H:
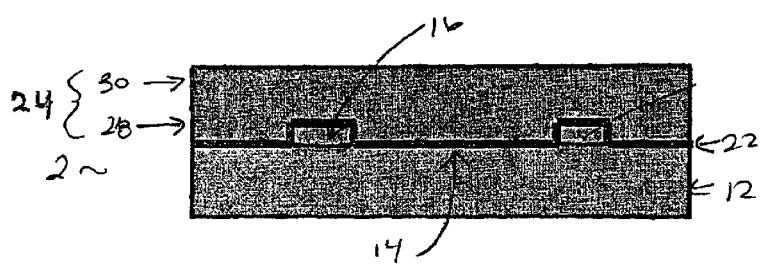

FIGS. 3G and 3H illustrate the deposition of two sequential sublayers of SOG 28 and 30 to form second electrically-insulating sublayer 24. The first SOG sublayer 28 is spin-coated onto the electronic component 2, preferably using the Headway spinner. For a 100 mm diameter substrate, approximately 2 mL of SOG is required to form a SOG layer 5000 Angstroms thick. The first SOG sublayer 28 is then polymerized, preferably by annealing at 400° C. in a rapid thermal anneal oven, such as the AST 2000 available from STEAG RTP Systems (San Jose, Calif.), resulting in a layer having the hardness of silicon dioxide. After applying the first SOG sublayer 28, electronic component 2 is again cleaned in a 2:1 (v/v) mixture of water and hydrofluoric acid. The cleaning step roughens the surface of first SOG sublayer 28 to enhance adhesion of the second SOG sublayer 30. Thereafter, a second SOG sublayer 30 is spin-coated to the surface of electronic component 2 and annealed, as described above, completing the second electrically-insulating sublayer and providing a surface that is smooth and planarized. The conductors 16 are then embedded under the first electrically-insulating layer 22 and the first and second SOG layers 28 and 30, which together form second electrically-insulating sublayer 24, as shown in FIG. 3H.

Figure 3I:
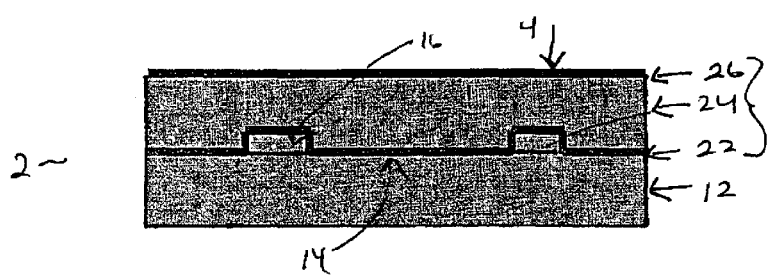

A third electrically-insulating layer 26 composed of a material having good conformal properties is next deposited on the second electrically-insulating sublayer 24, as shown in FIG. 3I, to further smooth the planarized surface of the electronic component 2 and provide a surface material useful for bonding of the fluid-handling component. Preferably, the third electrically-insulating sublayer 26 comprises a layer of TEOS. When the third electrically-insulating sublayer 26 is TEOS, the layer is preferably deposited by PECVD as described above.

Following deposition of the third electrically-insulating sublayer 26, the electronic component 2 comprises first substrate 12 having surface 14, first electrically-insulating sublayer 22 deposited on first substrate surface 14, second electrically-insulating sublayer 24 deposited on first electrically-insulating sublayer 22, third electrically-insulating sublayer 26 deposited on second electrically-insulating sublayer 24, and conductor 16 embedded between first substrate surface 14 and first electrically-insulating sublayer 22. Electronic component 2 has a smooth, planarized surface to which the fluid-handling component 6 is affixed.

Additional preparation of electronic component 2, and fabrication of fluid-handling component 6, depend on the particular application required. Two particularly preferred embodiments of the device include an embodiment for performing e-field lysis and an embodiment for performing PCR.

In e-field lysis embodiments, the electronic component 2 further comprises electrodes 34 extending from the embedded conductors 16 into the cavity 10 formed between the electronic component 2 and the fluid-handling component 6. The steps for completing the electronic component 2 for this embodiment are illustrated in FIGS. 3J to 3U.

Figure 3J:
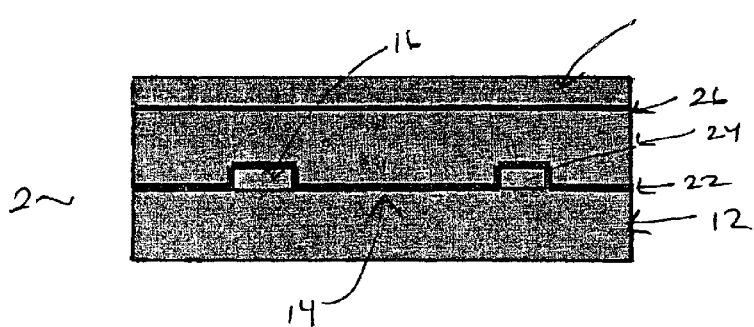
Figure 3K:
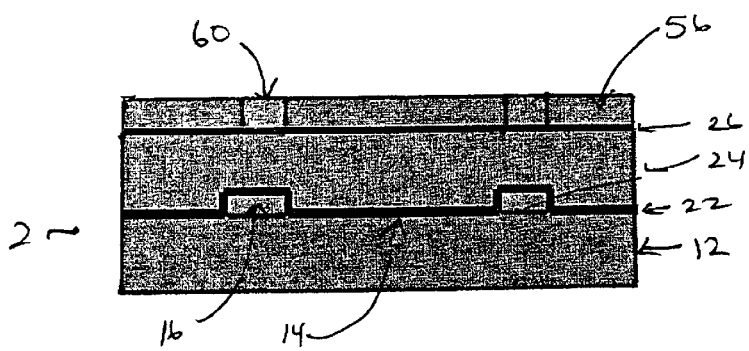
Figure 3L:
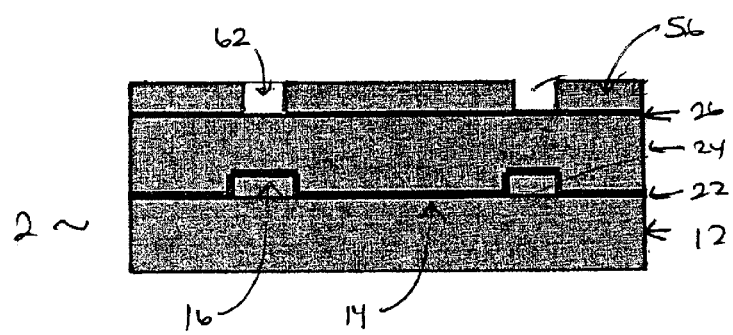

The first step in the process is vapor priming the electronic component 2 with HMDS in preparation for a second round of photolithography on electronic component 2. The electronic component 2 is then coated with a second layer of photoresist 56, most preferably SRP 950-1.0 resist (Shipley), as shown in FIG. 3J. Those skilled in the art will recognize that many photoresists, such as AZ 4400 (AZ Electronic Materials, Somerville, N.J.), can be substituted for SRP 950-1.0. The second photoresist layer 56 is exposed through a second photomask using a mask aligner to define a pattern 60 for the electrode 34, as shown in FIG. 3K. The second photoresist layer 56 is then developed using an appropriate developing agent to remove the exposed portions of photoresist layer 56, thereby creating an electrode trench 62 extending through second photoresist layer 56 and exposing a portion of the third electrically-insulating sublayer 26, as shown in FIG. 3L. The electronic component 2 is then cleaned again, preferably using oxygen plasma.

Figure 3M:
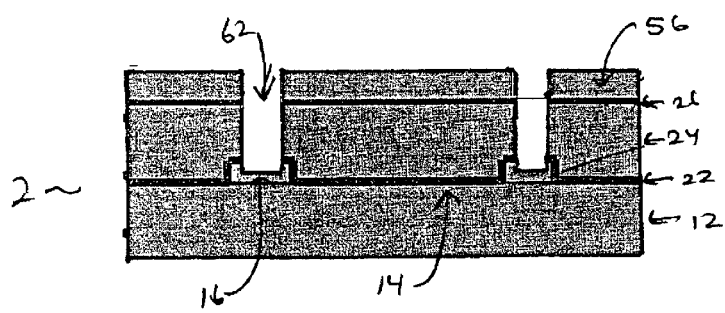
Figure 3N:
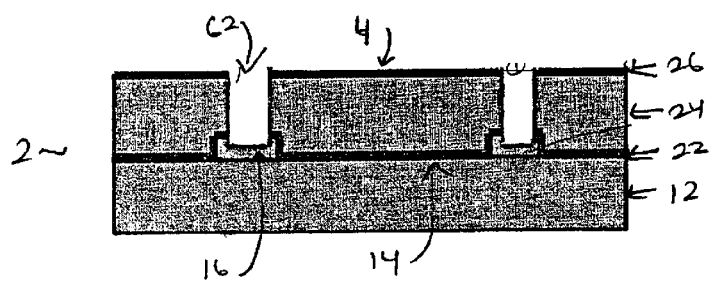
Figure 3O:
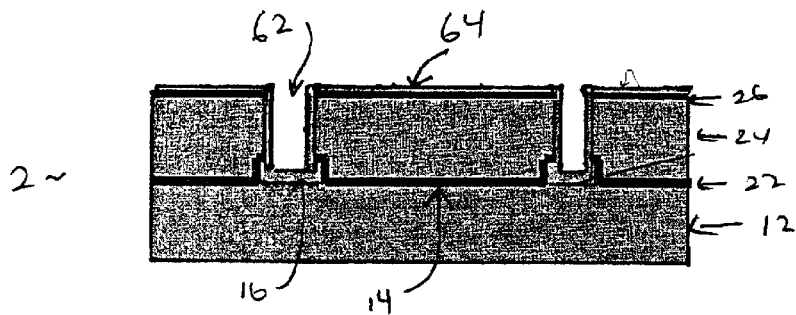

Next, the first, second and third electrically-insulating sublayers 22, 24, and 26 are etched, as shown in FIG. 3M. Plasma etching is preferred to wet etching because, in general, plasma etching is easier to control than simple immersion wet etching. In the plasma etching process, an inert molecular gas, preferably $CF_4$, is introduced into a high pressure chamber containing the electronic component 2. A glow discharge is used to produce chemically reactive atoms, radicals and ions from the inert gas. The plasma etches through the uncovered portion of Ad the third, second and then first electrically-insulating sublayers 26, 24, and 22 respectively, thereby extending the electrode trench 62 to expose the conductor 16 (which is resistant to the etching media) at the bottom of the trench 62. The remaining second photoresist layer 56 is then burned off using oxygen plasma, as shown in FIG. 3N, leaving the planarized surface of the third electrically-insulating sublayer 26 exposed.

Next a layer of seed metal 64 is deposited in electrode trench 62 and on electronic component 2, to enhance adhesion of the electrode material 66. The seed metal 64 preferably comprises a combination of Ti and tungsten (W), which is deposited by vapor deposition to a thickness preferably from about 100 to about 1000 Angstroms, more preferably from about 100 to about 500 Angstroms, and most preferably from about 200 to about 500 Angstroms, as shown in FIG. 6F.

Figure 3P:
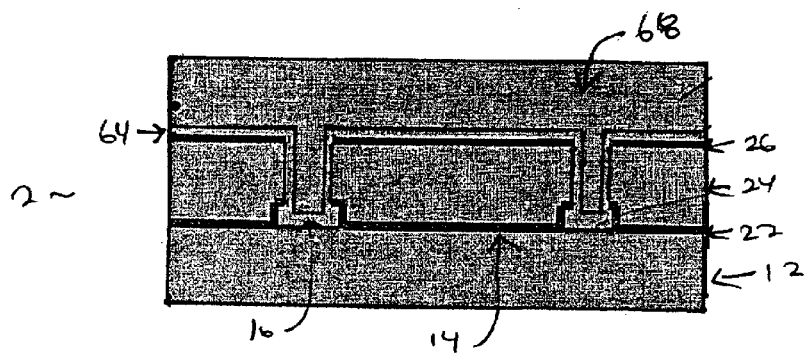
Figure 3Q:
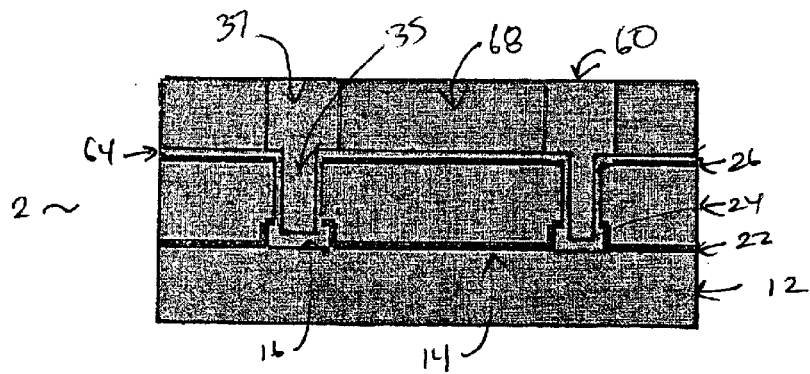
Figure 3R:
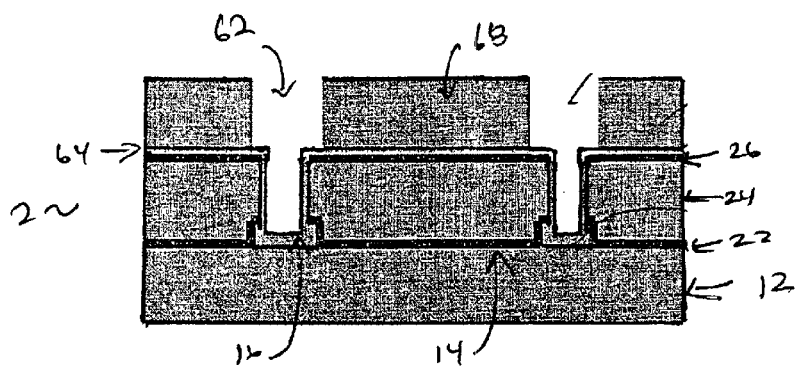

The electronic component 2 is next vapor primed with HMDS and the photolithography process is repeated a third time, as shown in FIGS. 3P–R. A third photoresist layer 68, preferably AZ 9260 photoresist (AZ Electronic Materials, Somerville, N.J.), is preferably spin-coated on the electronic component 2, as shown in FIG. 3P. The third photoresist layer 68 is exposed through a third photomask in a mask aligner to produce a plating pattern in the third resist layer 68 as shown in FIG. 3Q. The pattern preferably extends beyond the edges of the trench 62, thus forming a neck 35 and a head 37 for the electrode 34. The third photoresist layer 68 is then developed, preferably with AZ 400K resist developer (AZ Electronic Materials, Somerville, N.J.), to remove the exposed resist in the electrode regions, as shown in FIG. 3R, thereby extending electrode trench 62 through third photoresist layer 68. The electronic component 2 is then cleaned again, preferably with oxygen plasma.

Figure 3S:
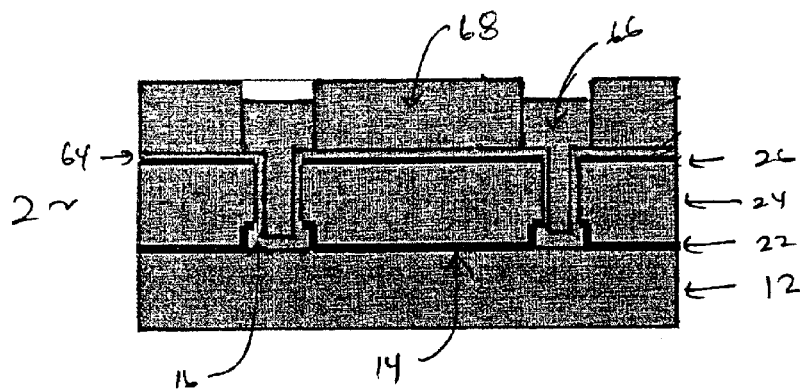

The electrode 34 is completed by depositing a layer of electrode material 66 in electrode trench 62, as shown in FIG. 3S. Preferably electrode material 66 is Au, which is preferably deposited using electroplating or sputtering methods. Electrode material 66 is deposited to a height preferably from about 1 to about 12 microns, more preferably from about 5 to about 12 microns, and most preferably about 10 microns.

Figure 3T:
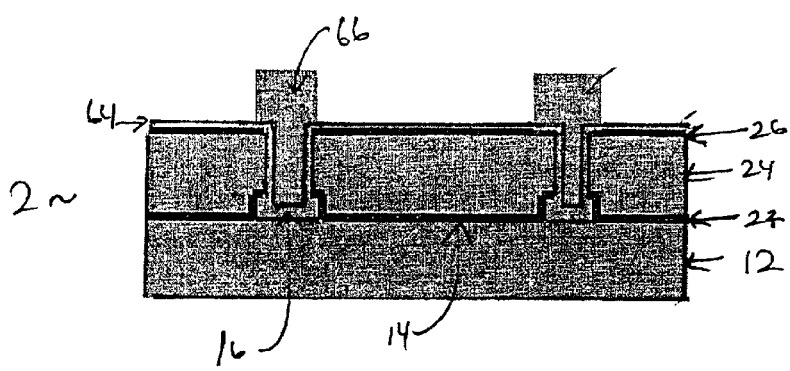
Figure 3U:
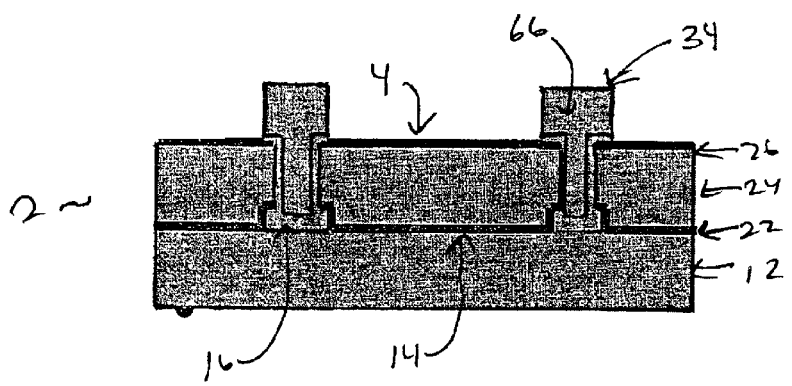

The head 37 of the electrode 34 is then exposed by stripping the remaining resist in third resist layer. 68 using a resist developer, preferably ST-33 stripper (ACSI, Inc.), preferably at 90° C. for 30 minutes, as shown in FIG. 3T. Excess seed metal 64 on the third electrically-insulating layer 26 is etched, preferably using a 1:1 (v:v) mixture of X-20 gold etch and water followed by $H_2O_2$ heated to 35° C., leaving electrodes 34 and third electrically-insulating sublayer 26 exposed, as shown in FIG. 3U.

The completed electronic component 2 for the e-field lysis embodiment described herein comprises first substrate 12 having surface 14, first electrically-insulating sublayer 22 deposited on first substrate surface 14, second electrically-insulating sublayer 24 deposited on first electrically-insulating sublayer 22, third electrically-insulating sublayer 26 deposited on second electrically-insulating sublayer 24, embedded conductor 16 embedded between first substrate surface 14 and first electrically-insulating sublayer 22, and electrode 34 extending from embedded conductor 16 through first, second and third electrically-insulating sublayers 22, 24 and 26. The third electrically-insulating layer 26 has a smooth, polished and planarized surface.

Figure 4A:
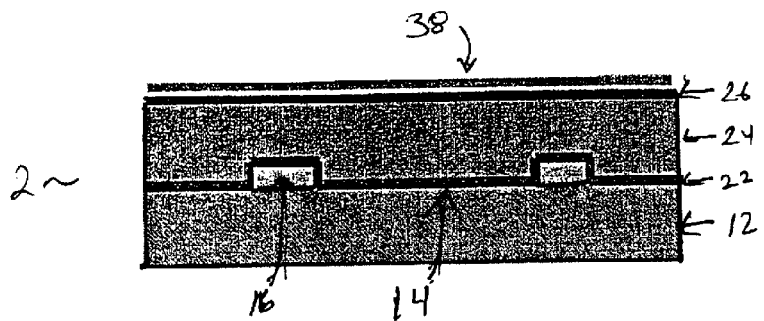
FIGS. 4A to 4J schematically illustrate a method for fabricating the fluid-handling component of a microfluidic device for performing the polymerase chain reaction.

In the PCR embodiment, the electronic component 2 further comprises an additional layer of silicon (Si) 38 deposited on the third insulating sublayer 26, as shown in FIG. 4A, to provide a biocompatible surface that enhances the adhesion of a glass fluid handling component 6. Preferably, silicon layer 38 is deposited by sputtering in a physical vapor deposition unit such as the Novellus 6000.

The silicon layer is preferably about 1,000 to about 4,000 Angstroms thick, more preferably about 1,500 to about 3,000 Angstroms thick, and most preferably about 1,500 to about 2,000 Angstroms thick.

For PCR-performing embodiments, the completed electronic component 2 of the device comprises first substrate 12 having surface 14, first electrically-insulating sublayer 22 deposited on first substrate surface 14, second electrically-insulating sublayer 24 deposited on first electrically-insulating sublayer 22, third electrically-insulating sublayer 26 deposited on second electrically-insulating sublayer 24, embedded conductor 16 embedded between first substrate surface 14 and first electrically-insulating sublayer 18, and silicon layer 38 deposited on third electrically-insulating sublayer 26. In this embodiment, the embedded conductors 16 function as resistive heaters for the contents of the cavity 10 between the electronic component 2 and the fluid-handling component 6.

Fluid-Handling Component

The fluid-handling component can be fabricated using a variety of processes. In e-field lysis embodiments of the device, the fluid-handling component is fabricated by using photolithographic methods to create a mold defining a contoured surface comprising the fluid handling elements, pouring a polymeric compound over the mold, allowing the polymeric compound to harden and removing the hardened polymer from the mold. In PCR embodiments of the device, photolithography is used to create an etch pattern on a substrate, and the substrate is then etched to form a contoured surface defining the fluid-handling elements.

FIGS. 3V–3Z illustrate the steps for preparing the fluid-handling component 6 for e-field lysis devices. Fluid-handling component 6 is prepared using a positive mold 72, in which a pattern of microchannels 36 and other fluid-handling components are positively produced on the surface of the mold. A polymeric material 82 is deposited on the mold and hardened to form the fluid-handling component 6 having a contoured surface 8 defining the pattern of microchannels 36 and other fluid-handling components. Most preferably, the pattern is complementary to the electrode 34 present in the electronic component 2 as described above, such that when the fluid-handling component 6 is affixed to the electronic component 2 the electrode 34 extends into the pattern of microchannels 36.

Figure 3V:
Figure 3W:
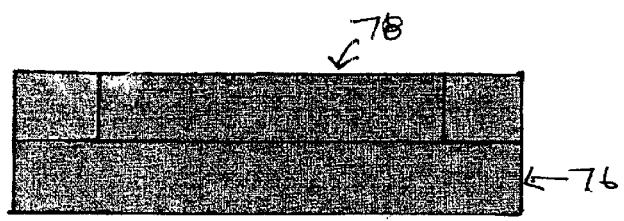
Figure 3X:
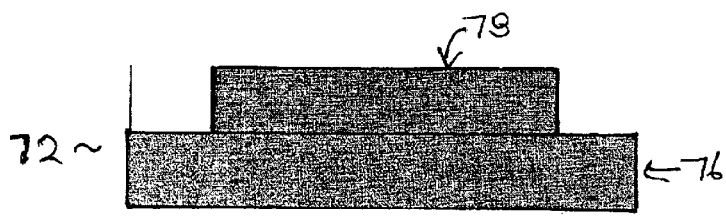
Figure 3Y:
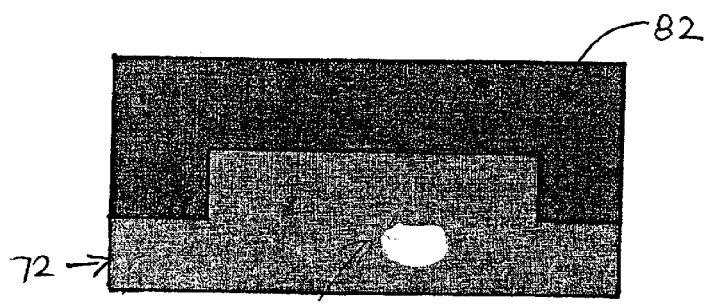
Figure 3Z:
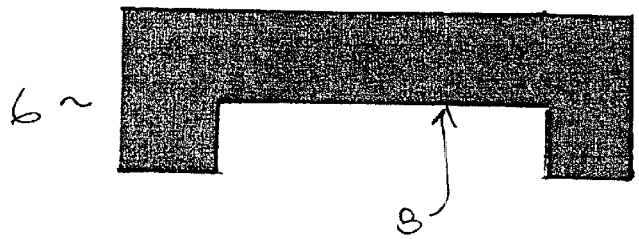

Mold 72 is fabricated using a second substrate 76, which is preferably glass or plastic. The second substrate 76 is cleaned, preferably in a megasonic cleaner using a cleaning solution comprising equal parts by volume of $NH_4OH$ and $H_2O_2$. After cleaning, the second substrate 76 is vapor primed, preferably using HMDS, in preparation for photolithography. The second substrate 76 is then coated with a first layer of photoresist 78, preferably AZ 9260 (AZ Electronic Materials, Somerville, N.J.), as illustrated in FIG. 3V. Photoresist layer 78 is exposed through a first photomask in a mask aligner to produce the mold pattern in the photoresist layer 78, as shown in FIG. 3W. The patterned photoresist layer 78 is then developed to remove the resist that was exposed in the previous step, thus forming the mold 72 for the fluid-handling component 6, as shown in FIG. 3X. The shape of the mold is designed to create a pattern of microchannels 36 on the contoured surface 8 of the fluid-handling component 6.

A polymeric compound 82, preferably PDMS, is then poured over the mold 72 and allowed to harden to form the fluid-handling component 6, as shown in FIG. 6Q. PDMS is preferred because it adheres well to glass or silicon dioxide surfaces; however any compound having similar characteristics is equally useful. After the polymer 82 has hardened, the fluid-handling component 6 is removed from mold 72, as shown in FIG. 6R. Access holes 32 can then be made as necessary by punching holes with a hollow steel tube through the fluid-handling component 6.

After preparing the electronic component 2 and the fluid-handling component 6, the components are aligned so that the electrode 34 extends into the microchannel pattern 36. The electronic component 2 and the fluid-handling component 6 are then bonded to complete the device. When PDMS is used for fluid-handling component 6, and third electrically-insulating sublayer 26 is TEOS, a chemical bond forms between the silicon molecules in the PDMS and the silicon molecules in the TEOS. In alternative embodiments, anodic bonding is preferred for bonding fluid-handling component 6 to electronic component 2. Those of skill in the art will recognize the applicability of additional bonding methods, depending on the materials used for the electronic component 2 and the fluid-handling component 6. The completed e-field lysis device is illustrated in FIG. 1 and FIG. 3AA.

The fluid-handling component 6 for the PCR embodiment is fabricated using the steps shown in FIGS. 4B–4J. A second substrate 84 is cleaned, preferably in a megasonic cleaner containing a 1:1 (v:v) solution of $NH_4OH$ and $H_2O_2$ at 20° C. for 15 minutes. The second substrate 84 is preferably glass.

Figure 4B:
Figure 4C:
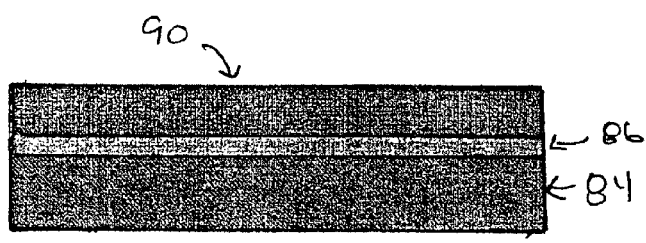

As shown in FIG. 4B, an etch mask 86 is deposited on the second substrate 84. The etch mask 86 is preferably comprised on a sublayer of chromium (Cr) followed by a sublayer of Au deposited on the substrate using standard vapor deposition techniques in an evaporator such as the Temescal Airco FC 1800. The etch mask 86 is preferably between about 500 and 10,000 Angtroms thick, more preferably between about 1,000 and 5,000 Angstroms thick, and most preferably about 3000 Angstroms thick. The Cr sublayer is preferably between about 500 and 3,000 Angtroms thick, more preferably between about 1,000 and 2,000 Angstroms thick, and most preferably about 1000 Angstroms thick. The Au sublayer is preferably between about 1,000 and 4,000 Angtroms thick, more preferably between about 1,500 and 2,500 Angstroms thick, and most preferably about 2000 Angstroms thick.

Figure 4D:
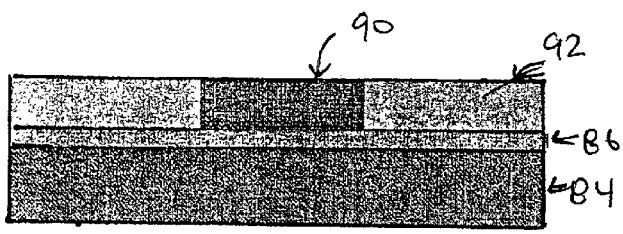
Figure 4E:
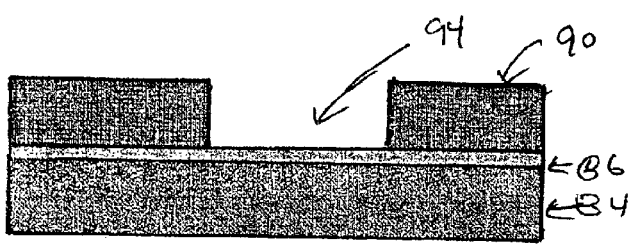

After deposition of the etch mask 86, the second substrate 84 is vapor primed with HMDS wider the same conditions used to vapor prime first substrate 12 to prepare fluid-handling component 6 for photolithography. A first layer of photoresist 90, preferably AZ 950 photoresist (AZ Electronic Materials, Somerville, N.J.), is deposited on the etch mask 86 by spin coating, preferably with the Headway spinner described above, as shown in FIG. 4C. The photoresist layer 90 is then exposed through a photomask in a mask aligner to produce a metal etch pattern 92 in the photoresist layer 90, as shown in FIG. 4D. The patterned photoresist layer 90 is developed, preferably using AZ CD 26K photoresist developer (AZ Electronic Materials, Somerville, N.J.), to form a trench 94 in photoresist layer 90 with metal layer 86 exposed at the bottom of trench 94, as shown in FIG. 4E.

Figure 4F:
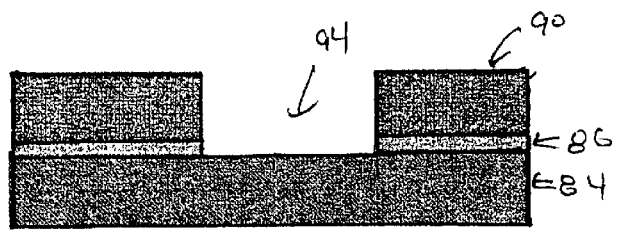
Figure 4G:
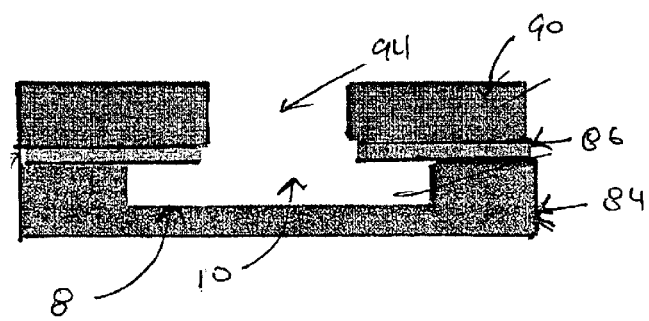
Figure 4H:
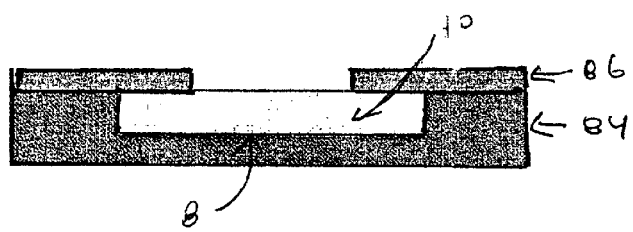
Figure 4I:
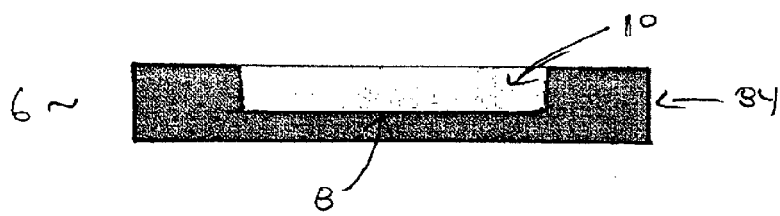
Figure 4J:
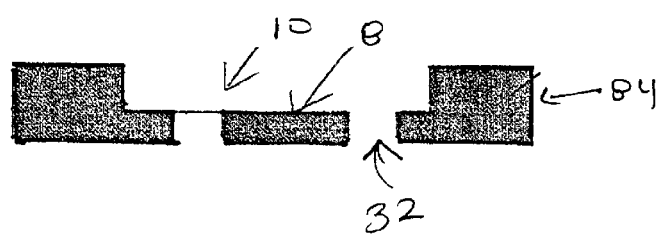

As shown in FIG. 4F, the exposed portion of the etch mask 86 is etched at room temperature using a commercial etch, preferably X-20 etch available from Arch Chemicals, Inc. (Norwalk, Conn.), thereby exposing a portion of the second substrate 84. The second substrate 84 is then etched, resulting in a contoured surface 8 having a depth preferably of about 20 to 200 microns on second substrate 84, as shown in FIG. 4G. Preferably the second substrate 84 is wet etched by immersion in a 2:1 (v/v) mixture of hydrogen fluoride and nitric acid at room temperature for 10 to 15 minutes. The photoresist layer 90 is then developed using a commercial photoresist developer, preferably ST-33 stripper from ACSI, at 70° C. for 30 minutes, as shown in FIG. 4H. The remaining portion of the etch mask layer 86 is then etched using a commercial etch, preferably a chrome etch available from Arch Chemicals, at room temperature for 5 to 30 minutes, as shown in FIG. 4I, leaving completed fluid-handling component 6 having contoured surface 8. Two access holes 32, preferably 2 mm in diameter, are then manually punched in fluid-handling component 6 using a metal punch, as shown in FIG. 4J.

The contoured surface 8 of the second substrate 84 is aligned with the silicon layer 38 of the electronic component 2, and the two pieces are bonded together to form the PCR device. The contoured surface 8 of the fluid-handling component 6 defines a reaction chamber 40 between the electronic component 2 and the fluid-handling component 6. Preferably the electronic component 2 and the fluid-handling component 2 are anodically bonded in a bonding chamber such as the Series I available from Sarnoff Corp. (Princeton, N.J.) or the EV520 available from EV Group Inc. (Phoenix, Ariz.). The conditions for anodic bonding are preferably 450° C. and approximately 1875 torr (2.5 bar) for 15 minutes using 1000 volts.

In anodic bonding, sodium ions present in the substrates become mobile and produce a depletion layer at the silicon/glass interface. The resulting electrostatic attraction between these two charge layers in the substrate material brings the surfaces into intimate contact and a strong, irreversible, airtight bond forms between electronic component 2 and fluid-handling component 6.

To obtain a strong anodic bond, it is important to have planarized surfaces. To obtain a reliable bond between electronic component 2 and fluid-handling component 6, it is important to minimize the material stresses resulting from the temperatures used in the bonding process. The component materials, therefore, must be selected carefully to have similar expansion coefficients.

The Examples that follow are illustrative of specific embodiments of the invention and various uses thereof. They are set forth for explanatory purposes only, and are not to be taken as limiting the invention.

EXAMPLE 1

Electric Field Cell Lysis Device

A microfluidic device provided by the invention and specifically designed for performing electric cell lysis is illustrated in FIGS. 1 and 2.

A glass substrate 100 mm in diameter was cleaned in a Semiconductor Technologies megasonic cleaner. The substrate was placed in a container with a cleaning solution comprising equal parts by volume of $NH_4OH$ and $H_2O_2$ and cleaning was performed at 20° C. for 15 minutes.

The substrate was then pretreated prior to the photolithography process by heating in an IMTEC Star 2000 oven at 150° C. for 40 minutes. The substrate was primed with HMDS immediately following this dehydration bake by placing the substrate in the Star 2000 oven containing 1 milliliter of high vapor pressure HMDS liquid for 15 minutes and allowing the vapor to coat the surface of the substrate.

In the first step of the photolithography process, the primed substrate was coated with a 1 micron layer of AZ 6210 photoresist (AZ Electronic Materials, Somerville, N.J.) by spin coating. The primed substrate was spin-coated in a Headway spinner (Headway Research. Inc., Garland. Tex.) by mounting the substrate on a vacuum chuck and rapidly accelerating the chuck at a controlled rate of 3200 rpm for 30 seconds, while 200 milliliters of liquid photoresist was dispensed on the surface of the substrate. A custom photomask (LSI Photomask, Chandler, Ariz.) was positioned over the substrate in a Karl Suss MA-150 mask aligner. The photoresist was allowed to set for 5 minutes at room temperature, and the substrate was then exposed in the mask aligner to UV light having a wavelength of 325 nm and an intensity of 11 mA/cm for 15 minutes.

To complete the photolithography process, the substrate was washed with AZ 527 resist developer (AZ Electronic Materials, Somerville, N.J.). The substrate was then cleaned with oxygen plasma in a Branson IPC Asher/Etcher according to manufacturers instructions.

Layers of Ti, Pt and Au were sequentially deposited on the substrate by standard vapor deposition techniques forming an overall layer 0.3 microns thick, as follows. The substrate was loaded into a Temescal Airco FC1800 high vacuum chamber. Each metal was loaded into a crucible, which was then placed in the vacuum chamber at room temperature. The pressure in the chamber was reduced to less than $1 \times 10^{-6}$ torr. The substrate was maintained in the vacuum chamber for 15 minutes. After removal from the chamber, the metal deposited on the surface of the substrate was allowed to set for 5 minutes at room temperature. The substrate was then immersed in acetone to dissolve the photoresist and remove the excess metal, leaving the exposed conductors.

A 3000 Angstrom layer of TEOS was then deposited on the substrate using a Novellus PECVD unit (Novellus Systems, San Jose, Calif.). The substrate was cleaned by immersion in a 2:1 (v/v) mixture of water and buffered hydrofluoric acid for 15 seconds, and then air-dried for 5 minutes.

The substrate was planarized by coating with a 5000 Angstrom layer of SOG using the Headway spinner. The SOG layer was formed by mounting the substrate on a vacuum chuck and rapidly accelerating the chuck at a controlled rate of 3200 rpm for 30 seconds, while 2 milliliters of SOG was dispensed on the surface of the substrate. The SOG layer was then annealed at 400° C. for 5 minutes in a STEAG AST 2000 rapid thermal anneal oven. The SOG layer was cleaned by immersion in a 2:1 (v/v) mixture of water and buffered hydrofluoric acid for 15 seconds, and then air-dried for 5 minutes. A second 5000 Angstrom layer of SOG was then deposited on the substrate and annealed, leaving the conductors embedded in a 1 micron layer of SOG.

A second layer of TEOS was deposited using the same procedure outlined above to improve uniformity and step coverage.

The photolithography process was then repeated using SRP 950 1.0 resist and AZ CD 26 developer (AZ Electronic Materials, Somerville, N.J.) and a photomask designed to form the electrode pattern. The substrate was again primed with HMDS in the Star 2000 oven. The primed substrate was then coated with a 1 micron layer of SRP 950 1.0 photoresist in the Headway spinner by rapidly accelerating the chuck at a controlled rate up to a maximum rotational speed of 3200 rpm for 30 seconds, while 300 milliliters of liquid photoresist was dispensed on the surface of the substrate. A custom photomask was positioned over the substrate in a Karl Suss MA-150 mask aligner. The photoresist was allowed to set for 5 minutes at room temperature, and the substrate was then exposed to UV light having a wavelength of 325 nm and an intensity of 11 mA/cm for 15 minutes.

To complete the photolithography process, the substrate was immersed and washed with AZ CD 26 resist developer (AZ Electronic Materials, Somerville, N.J.) to obtain the pattern for the placement of electrodes. The substrate was then cleaned with oxygen plasma in the Branson IPC Asher/Etcher.

The exposed TEOS layer and the underlying SOG layer were plasma etched using $CF_4$ gas in the Branson IPC Asher/Etcher; The remaining resist layer was burned off in the Branson IPC Asher/Etcher using oxygen plasma.

Electrodes were formed by sputtering a 500 Angstrom layer of titanium and tungsten (W) seed metal followed by a 2500 Angstrom layer of gold on the substrate in a MRC 603 (Materials Research Corporation, Orangeburg, N.Y.). This metal layer was vapor primed with HMDS, and a layer of AZ 9260 photoresist (AZ Electronic Materials, Somerville, N.J.) was spin-coated on the substrate using the spin-coating procedure detailed above. The third layer of photoresist was exposed to 325 nm UV light through a custom photomask to produce a plating pattern in the resist. The resist was then developed with AZ 400K resist developer (AZ Electronic Materials, Somerville, N.J.) and the resulting surface was cleaned with oxygen plasma in the Branson IPC Asher/Etcher. The electrodes were completed by electroplating a 10 micron layer of Au on the substrate surface at 55° C. using 10 milliamps for 20 minutes in a Bold Technologies (West Jordan, Utah) electroplating unit.

The resist layer was removed by soaking the substrate in ST-33 liquid resist stripper at 90° C. for 30 minutes. Excess Au was removed by immersing the substrate in X-20 gold etch at room temperature for 6 minutes. The excess portion of the Ti/W layer exposed following removal of excess Au was then removed by wet etching in hydrogen peroxide heated to 35° C. for 10 minutes.

To prepare the fluid-handling component, a second silicon substrate 100 mm in diameter was cleaned in a megasonic cleaner containing a 1:1 (v:v) solution of $NH_4OH$ and $H_2O_2$ at 20° C. for 15 minutes. This substrate was vapor primed with HMDS in the Star 2000 oven under the same conditions used to vapor prime the first substrate. A layer of AZ 9260 resist (AZ Electronic Materials, Somerville, N.J.) was deposited on the second substrate by spin coating using the Headway spinner. The photoresist was exposed through a custom photomask in the Karl Suss mask aligner to produce a plastic mold pattern in the photoresist. The patterned resist was then developed using AZ 400K developer (AZ Electronic Materials, Somerville, N.J.) leaving the mold form. PDMS was poured over the mold and allowed to harden at room temperature for 24 hours forming a layer 4 millimeters thick. After hardening, the PDMS component was removed from the mold. Two access holes having a 2 millimeter diameter were manually punched in the PDMS using a steel tube to allow access to the pattern of microchannels formed in the molded PDMS component.

The PDMS component was aligned with the electronic component and the PDMS component bonded to the electronic component due to the ability of PDMS to bond with oxide surfaces. The electrodes extended into the pattern of microchannels between the first and fluid-handling components.

EXAMPLE 2

Polymerase Chain Reaction Device

A microfluidic device provided by the invention and specifically designed for performing polymerase chain reaction is illustrated in FIG. 4.

A glass substrate 100 mm in diameter was cleaned in a Semiconductor Technologies megasonic cleaner. The substrate was placed in a container with a cleaning solution comprising equal parts by volume of $NH_4OH$ and $H_2O_2$. The cleaner was run at 20° C. for 15 minutes.

The substrate was then pretreated prior to the photolithography process by spin drying and heating in an IMTEC Star 2000 vacuum oven at 150° C. for 40 minutes. The substrate was primed with HMDS in the Star 2000 oven immediately following this dehydration bake by placing the substrate in the Star 2000 oven with a container holding 1 milliliter of high vapor pressure HMDS liquid for 5 minutes and allowing the vapor to coat the surface of the substrate.

In the first step of the photolithography process, the primed substrate was coated with a 1 micron layer of AZ 6210 photoresist (AZ Electronic Materials, Somerville, N.J.) by spin-coating with a Headway spinner. The primed substrate was spin-coated by mounting the substrate on a vacuum chuck and rapidly accelerating the chuck at a controlled rate of 3200 rpm for 30 seconds, while 200 milliliters of liquid photoresist was dispensed on the surface of the substrate. The photoresist was allowed to set for 5 minutes at room temperature. The substrate was then aligned with a custom photomask in a Suss MA-150 mask aligner and was then exposed in the mask aligner to UV light with wavelength of 325 nm for 30 seconds.

To complete the photolithography process, the substrate was immersed in AZ 527 resist developer (AZ Electronic Materials, Somerville, N.J.) to obtain the pattern for the conductors. The substrate was then cleaned with oxygen plasma in a Branson IPC Asher/Etcher.

A 500 Angstrom layer of Ti, subsequently followed by a 200 Angstrom layer of Pt, was deposited on the substrate by vapor deposition. The substrate was loaded into a Temescal Airco FC1800 high vacuum chamber. The Ti and Pt were sequentially loaded into a crucible at room temperature. The pressure in the chamber was reduced to $1 \times 10^{-6}$ torr causing the metal to traverse the chamber and form a film on the substrate. The substrate was maintained in the vacuum chamber for 12 minutes at room temperature. The substrate was allowed to rest for 15 minutes in the chamber. The substrate was then immersed in acetone to dissolve the photoresist and remove the excess metal, leaving the exposed conductors.

A 3000 Angstrom layer of TEOS was then deposited for insulation on the substrate using PECVD in a Novellus PECVD system. The substrate was cleaned by immersion in a 2:1 (v/v) mixture of water and buffered hydrofluoric acid for 15 seconds, and dried with nitrogen gas in the Star 2000 oven for 2 minutes.

The substrate was planarized by coating with a 5000 Angstrom layer of SOG using a photoresist spinner. The substrate was manually placed on the vacuum chuck, and the spinner was accelerated at a constant rate to 3200 rpm while the SOG was manually dispensed using an eyedropper. The SOG layer was annealed at 400° C. for 5 minutes in a STEAG AST 2000 rapid thermal anneal oven, and cleaned by immersion in a 2:1 (v/v) mixture of water and buffered hydrofluoric acid for 15 seconds, then air-dried for 6 minutes. A second 5000 Angstrom layer of SOG was then deposited on the substrate and annealed, leaving the conductors embedded in a 1 micron layer of SOG.

A second layer of TEOS having a thickness of 6000 Angstroms was deposited using the same procedure outlined above to improve uniformity and step coverage. A 2000 Angstrom layer of amorphous silicon was then sputtered onto the substrate in a Novellus 6000 PVD unit to form a electrically-conductive layer.

To prepare the fluid-handling component, a second glass substrate 100 mm in diameter was cleaned in a megasonic cleaner containing a 1:1 (v:v) solution of $NH_4OH$ and $H_2O_2$ at 20° C. for 15 minutes. A first layer of Cr having a thickness of 1000 Angstroms was deposited on the substrate by standard vapor deposition in a Temescal Airco FC1800 oven, subsequently followed by a 2000 Angstrom layer of Au. The substrate was first loaded into the Temescal Airco FC1800 high vacuum chamber. The Cr and Au were sequentially loaded into a crucible at room temperature. The pressure in the chamber was reduced to $1 \times 10^{-6}$ torr, and the substrate was maintained in the vacuum chamber for 12 minutes at room temperature during deposition. The substrate was then allowed to remain for 15 minutes in the chamber.

The second substrate was vapor primed with HMDS under the same conditions used to vapor prime the first substrate. A layer of AZ 950 photoresist (AZ Electronic Materials, Somerville, N.J.) was deposited on the second substrate by spin coating with the Headway spinner. The photoresist was exposed through a custom photomask in the Suss mask aligner to produce a metal etch pattern in the photoresist. The patterned resist was then developed using AZ CD 26K photoresist developer (AZ Electronic Materials, Somerville, N.J.).

The exposed Cr and Au were removed using X-20 etch (Arch Chemicals). The glass substrate was then etched by immersion in a 2:1 (v/v) mixture of hydrogen fluoride and nitric acid at room temperature for 10 minutes. The photoresist was stripped using ST-33 photoresist stripper (ACSI) at 70° C. for 30 minutes. The remaining Cr and Au were then etched using a chrome etch (Arch Chemicals).

Two access holes 2 millimeters in diameter were drilled in the glass substrate using a mechanical drill at 40,000 rpm.

The surface of the second substrate opposite the access holes was aligned with the first substrate and the two pieces were anodically bonded at 450° C. and approximately 1875 torr (2.5 bar) for 15 minutes using 1000 volts in an EV Group EV520 bonding chamber.

It should be understood that the foregoing disclosure emphasizes certain specific embodiments of the invention and that all modifications or alternatives equivalent thereto are within the spirit and scope of the invention as set forth in the appended claim.

What is claimed is:

1. A microfluidic device comprising:
   (a) an electronic component comprising a substrate having a surface, a layer of electrically-conductive material deposited on a portion of the substrate surface, and a layer of insulating material deposited on the layer of electrically-conductive material and the substrate surface, wherein the layer of insulating material has a substantially planar surface opposite the substrate surface; and
   (b) a fluid-handling component having a contoured first surface and a second surface opposite the contoured first surface, wherein the contoured first surface of the fluid-handling component is affixed to the layer of insulating material on the electronic component, thereby forming one or a plurality of cavities between the electronic component and the fluid-handling component, and wherein the electrically-conductive material is in electrical or thermal communication with said cavities formed between the electronic component and the fluid handing component.

2. The device of claim 1 wherein the substrate is glass, silicon or plastic.

3. The device of claim 1 wherein the electrically-conductive material is titanium, platinum, gold, or a combination thereof.

4. The device of claim 1 wherein the layer of electrically-conductive material comprises a plurality of sublayers of electrically-conductive material.

5. The device of claim 4 wherein the layer of electrically-conductive metal comprises a titanium deposited on a portion of the substrate surface, a platinum sublayer deposited on the titanium sublayer, and a gold sublayer deposited on the platinum sublayer.

6. The device of claim 1 wherein the layer of insulating material is biocompatible material.

7. The device of claim 1 wherein the layer of insulating material comprises a plurality of sublayers of insulating material.

8. The device of claim 7 wherein one sublayer of insulating material is a planarizing material.

9. The device of claim 7 wherein the layer of insulating material comprises a first sublayer of tetraethylorthosilicate, a second sublayer of spin-on glass deposited on the first sublayer, and a third sublayer of tetraethylorthosilicate deposited on the second sublayer.

10. The device of claim 2 wherein the substrate is silicon, further comprising a second layer of insulting material deposited on the substrate surface between the substrate surface and the layer of electrically-conductive material.

11. The device of claim 10 wherein the second layer of insulating material is a material with good conformal properties.

12. The device of claim 11 wherein the second layer of insulating material is tetraethylorthosilicate.

13. The device of claim 1 wherein the fluid-handling component is composed of glass, silicon, plastic, quartz, sapphire, an epitaxial material or a polymer.

14. The device of claim 13 wherein the fluid-handling component is composed of polydimethylsiloxane.

15. The device of claim 1 further comprising an electrode extending through the layer of insulating material, wherein the electrode is in electrical communication with the embedded conductor.

16. The device of claim 15 wherein the electrode is composed of gold, platinum or titanium.

17. The device of claim 15 wherein the cavity between the electronic component and the fluid-handling component comprises a pattern of microchannels, and wherein the electrode extends into the pattern of microchannels.

18. The device of claim 1 wherein at least one of the cavities between the electronic component and the fluid-handling component comprises a reaction chamber.

19. The device of claim 1 wherein the fluid-handling component is affixed to the electronic component by anodic bonding.

20. The device of claim 1 further composing a layer of silicon deposited on the layer of insulating material.

21. A method for fabricating a microfluidic device comprising the steps of:
  (a) generating a pattern for depositing a electrically-conductive material on a surface of a substrate of a electronic component;
  (b) depositing a layer of electrically-conducive material on a portion of the substrate surface defined by the generated pattern;
  (c) depositing a layer of insulating material on the substrate surface and the layer of electrically-conductive material; and
  (d) fabricating a fluid handling component having a contoured first surface and a second surface opposite the contoured first surface; and
  (e) affixing the contoured first surface of the fluid-handling component to the electrically-insulating layer on the electronic component.

22. A microfluidic device fabricated according to the following method:
  (a) generating a pattern for depositing a electrically-conductive material on a surface of a substrate of a electronic component;
  (b) depositing a layer of electrically-conductive material on portion of the substrate surface defined by the generated pattern;
  (c) depositing a layer of insulating material on the substrate surface and the layer of electrically-conducive material; and
  (d) fabricating a fluid-handling component having a contoured first surface and a second surface opposite the contoured first surface; and
  (e) affixing the contoured first surface of the fluid-handing component to the electrically-insulating layer on the electronic component.

23. The method of claim 21 wherein the step of generating a pattern for depositing electrically-conductive material comprises photolithography.

24. The method of claim 21 further comprising the stops of:
  (a) generating a pattern for depositing a material for an electrode on the layer of insulating material;
  (b) removing the portion of the electrically-insulating layer covered by the pattern for depositing the electrode material, thereby forming a trench extending through the electrically-insulating layer and exposing the layer of electrically-conductive material;
  (c) depositing a layer of electrode material in the trench, thereby forming a electronic component comprising the substrate, the layer of electrically-conductive material, the layer of insulating material and the electrode.

25. The process of claim 21 wherein the step of generating the pattern for depositing the electrode material comprises photolithography.

26. The method of claim 21 further comprising the step of depositing a layer of silicon on the layer of insulating material between the layer of insulating material and the fluid-handling component, wherein the contoured surface of the fluid-handling component is affixed to the layer of silicon on the electronic component.

27. The method of claim 21 wherein the step of fabricating the fluid-handling component comprises the steps of:
  (a) creating a mold pattern on a second substrate;
  (b) depositing a material for the fluid-handling component on the mold pattern;
  (c) allowing the fluid-handling component material to harden; and
  (d) removing the hardened fluid-handling component material from the mold.

28. The method of claim 27 wherein the step of creating a mold pattern on the second substrate comprises photolithography.

29. The method of claim 21 wherein the step of fabricating the fluid-handling component comprises the steps of:
  (a) creating an etching pattern on a second substrate; and
  (b) etching the second substrate to form the contoured surface.

30. The method of claim 29 wherein the step of creating an etch pattern on the second substrate comprises photolithography.

31. The process of claim 21 wherein the step of fabricating a fluid-handling component comprises:
(a) depositing a layer of metal on a second substrate;
(b) forming a pattern on the layer of metal;
(c) removing the portion of the metal layer covered by the pattern;
(d) forming at least one cavity in the second substrate, wherein the opening of the cavity corresponds to the portion of the metal layer that was removed in step (c); and
(e) removing the hardened fluid-handling component material from the mold pattern.

32. The process of claim 31 wherein the step of forming a pattern on the layer of metal comprises photolithography.

33. A process for fabricating a microfluidic device comprising the steps of:
(a) generating a pattern for depositing a electrically-conductive material on a surface of a substrate of a electronic component;
(b) depositing a layer of electrically-conductive material on a portion of the substrate surface defined by the generated pattern;
(c) depositing a first sublayer of insulating material on the substrate surface and the layer of electrically-conductive material;
(d) depositing a second sublayer of insulating material on the first layer of insulating material;
(e) depositing a third sublayer of insulating material on the second sublayer of insulating material;
(f) generating a pattern for depositing a material for an electrode on the third sublayer of insulating material;
(g) removing the portion of the third electrically-insulating sublayer, the second electrically-insulating sublayer and the first electrically-insulating sublayer covered by the pattern for depositing the electrode material, thereby forming a trench extending through the third electrically-insulating sublayer, the second electrically-insulating sublayer and the first electrically-insulating sublayer and exposing the layer of electrically-conductive material;
(h) depositing a layer of electrode material in the trench, thereby forming a electronic component comprising the substrate, the layer of electrically-conductive metal material the first sublayer of insulating material, the second sublayer of insulating material, the third sublayer of insulating material, and the electrode;
(i) fabricating a fluid-handling component having a contoured first surface and a second surface opposite the contoured first surface; and
(j) affixing the contoured first surface of the fluid-handling component to the second electrically-insulating layer on the electronic component.

34. A microfluidic device fabricated according to the following method:
(a) generating a pattern for depositing a electrically-conductive material on a surface of a substrate of a electronic component;
(b) depositing a layer of electrically-conductive material on a portion of the substrate surface defined by the generated pattern;
(c) depositing a first sublayer of insulating material on the substrate surface and the layer of electrically-conductive material;
(d) depositing a second sublayer of insulating material on the first layer of insulating material;
(e) depositing a third sublayer of insulating material on the second sublayer of insulating material;
(f) generating a pattern for depositing a material for an electrode on the third sublayer of insulating material;
(g) removing the portion of the third electrically-insulating sublayer, the second electrically-insulating sublayer and the first electrically-insulating sublayer covered by the pattern for depositing the electrode material, thereby forming a trench extending through the third electrically-insulating sublayer, the second electrically-insulating sublayer and the first electrically-insulating sublayer and exposing the layer of electrically-conductive material;
(h) depositing a layer of electrode material in the trench, thereby forming a electronic component comprising the substrate, the layer of electrically-conductive material, the first sublayer of insulating material, the second sublayer of insulating material, the third sublayer of insulating material, and the electrode:
(i) fabricating a fluid-handling component having a contoured first surface and a second surface opposite the contoured first surface; and
(j) affixing the contoured first surface of tho fluid-handling component to the second electrically-insulating layer on the electronic component.

35. The method of claim 33 wherein the step of generating the pattern for depositing electrically-conductive material comprises photolithography.

36. The method of claim 33 wherein the step of fabricating a fluid-handling component comprises photolithography.

37. The method of claim 33 wherein the step of affixing the contoured surface of the fluid-handling component to the electrically-insulating layer of the electronic component comprises anodic bonding.

* * * * *

UNITED STATES PATENT AND TRADEMARK OFFICE
CERTIFICATE OF CORRECTION

PATENT NO.     : 6,787,339 B1  
DATED          : September 7, 2004  
INVENTOR(S)    : David B. Rhine and Thomas J. Smekal It is certified that error appears in the above-identified patent and that said Letters Patent is hereby corrected as shown below:

Column 23,
Line 46, after the word "electrically-conductive" delete the word "metal".

Signed and Sealed this

Fourteenth Day of December, 2004

JON W. DUDAS  
*Director of the United States Patent and Trademark Office*